United States Patent
Orimoto

(10) Patent No.: US 9,640,491 B2
(45) Date of Patent: May 2, 2017

(54) SEMICONDUCTOR DEVICE HAVING SEMICONDUCTOR ELEMENTS CONNECTED TO AN INTERMEDIATE PLATE BY A BRAZING FILLER METAL, AND MANUFACTURING METHOD FOR SEMICONDUCTOR DEVICE

(71) Applicant: TOYOTA JIDOSHA KABUSHIKI KAISHA, Toyota-shi, Aichi-ken (JP)

(72) Inventor: Norimune Orimoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/915,466

(22) PCT Filed: Sep. 4, 2014

(86) PCT No.: PCT/IB2014/001719
§ 371 (c)(1),
(2) Date: Feb. 29, 2016

(87) PCT Pub. No.: WO2015/033209
PCT Pub. Date: Mar. 12, 2015

(65) Prior Publication Data
US 2016/0218068 A1    Jul. 28, 2016

(30) Foreign Application Priority Data
Sep. 6, 2013   (JP) ................. 2013-185155

(51) Int. Cl.
*H01L 23/34*    (2006.01)
*H01L 23/00*    (2006.01)
(Continued)

(52) U.S. Cl.
CPC ........ *H01L 23/562* (2013.01); *H01L 21/4882* (2013.01); *H01L 21/565* (2013.01);
(Continued)

(58) Field of Classification Search
CPC . H01L 23/562; H01L 21/4882; H01L 21/565; H01L 23/3672; H01L 33/56;
(Continued)

(56) References Cited

U.S. PATENT DOCUMENTS 5,373,188 A * 12/1994 Michii ................ H01L 23/4951
257/666
2004/0108602 A1   6/2004 Nakajima et al.
(Continued)

FOREIGN PATENT DOCUMENTS

JP    H06-302722 A    10/1994
JP    H08-116007 A    5/1996
(Continued)

*Primary Examiner* — Khiem D Nguyen
(74) *Attorney, Agent, or Firm* — Oliff PLC

(57) ABSTRACT

A semiconductor device, including: an intermediate plate; a semiconductor element connected to one of surfaces of the intermediate plate by a brazing filler metal; a main plate connected to the other one of the surfaces of the intermediate plate by a brazing filler metal; and a resin layer, the intermediate plate having an external region extending to an outer side with respect to a region in which the intermediate plate is connected to the brazing filler metal, a first through-hole extending through the intermediate plate in the external region, the resin layer covering at least the brazing filler metal, the intermediate plate and a surface of the main plate in which the main plate faces the intermediate plate, the resin layer being also arranged inside the first through-hole.

8 Claims, 10 Drawing Sheets

(51) Int. Cl.
*H01L 23/492* (2006.01)
*H01L 23/495* (2006.01)
*H01L 23/16* (2006.01)
*H01L 21/48* (2006.01)
*H01L 21/56* (2006.01)
*H01L 23/367* (2006.01)
*H01L 23/31* (2006.01)

(52) U.S. Cl.
CPC .......... *H01L 23/16* (2013.01); *H01L 23/3114* (2013.01); *H01L 23/3672* (2013.01); *H01L 23/492* (2013.01); *H01L 23/49513* (2013.01); *H01L 23/49562* (2013.01); *H01L 23/3121* (2013.01); *H01L 2224/32245* (2013.01)

(58) Field of Classification Search
CPC ..... H01L 2023/4043; H01L 2023/4056; H01L 2023/4062; H01L 2224/48091; H01L 2924/181; H01L 23/4334; H01L 23/3107; H01L 21/56; H01L 2224/05647; H01L 2224/45147; H01L 2224/83447; H01L 23/367; H01L 2924/0665; H01L 21/4871; H01L 21/4878; H01L 23/49513
See application file for complete search history.

(56) References Cited

U.S. PATENT DOCUMENTS

| | | | |
|---|---|---|---|
| 2005/0073043 A1* | 4/2005 | Teshima | H01L 21/565 257/718 |
| 2008/0164589 A1 | 7/2008 | Son et al. | |
| 2011/0075451 A1* | 3/2011 | Bayerer | H01L 24/06 363/37 |
| 2012/0211764 A1 | 8/2012 | Okamoto et al. | |
| 2013/0256867 A1* | 10/2013 | Mori | H01L 23/3735 257/712 |

FOREIGN PATENT DOCUMENTS

| | | |
|---|---|---|
| JP | 2004-186622 A | 7/2004 |
| JP | 2007-088264 A | 4/2007 |
| JP | 2012-174927 A | 9/2012 |

* cited by examiner

SEMICONDUCTOR DEVICE HAVING SEMICONDUCTOR ELEMENTS CONNECTED TO AN INTERMEDIATE PLATE BY A BRAZING FILLER METAL, AND MANUFACTURING METHOD FOR SEMICONDUCTOR DEVICE

BACKGROUND OF THE INVENTION

1. Field of the Invention

The invention relates to a semiconductor device and a manufacturing method for a semiconductor device.

2. Description of Related Art

Japanese Patent Application Publication No. 2012-174927 (JP 2012-174927 A) describes a semiconductor device. The semiconductor device includes a semiconductor element, a lead frame and a mold resin. The lead frame is connected to the semiconductor element by solder. The mold resin covers the surfaces of the semiconductor element and lead frame.

In a manufacturing process for the semiconductor device described in JP 2012-174927 A, the mold resin is molded onto the semiconductor element and the lead frame. The mold resin shrinks at the time when the mold resin hardens. Thus, tensile stress occurs in the mold resin. The mold resin may peel off from the lead frame because of the tensile stress, so it is inconvenient.

SUMMARY OF THE INVENTION

A semiconductor device according a first aspect of the present invention includes: an intermediate plate; a semiconductor element connected to one of surfaces of the intermediate plate by a brazing filler metal adjacent to the semiconductor element; a main plate connected to the other one of the surfaces of the intermediate plate by a brazing filler metal adjacent to the main plate; and a resin layer, the intermediate plate having an external region extending to an outer side with respect to both a region in which the intermediate plate is connected to the brazing filler metal adjacent to the semiconductor element and a region in which the intermediate plate is connected to the brazing filler metal adjacent to the main plate, a first through-hole extending through the intermediate plate in the external region, the resin layer covering at least the brazing filler metal adjacent to the semiconductor element, the intermediate plate, the brazing filler metal adjacent to the main plate and a surface of the main plate in which the main plate faces the intermediate plate, the resin layer being also arranged inside the first through-hole.

With this semiconductor device, the external region of the intermediate plate is located inside the resin layer. The external region suppresses shrinkage of the resin layer, so it is possible to relax stress at resin interface with the main plate. Particularly, the resin layer is also arranged inside the first through-hole formed in the external region. That is, the resin layers on both sides of the intermediate plate are connected by the resin layer inside the first through-hole. Therefore, the intermediate plate is difficult to warp near the first through-hole. Thus, it is possible to effectively suppress shrinkage of the resin layer by the intermediate plate, so it is possible to suppress peeling of the resin layer from the main plate.

In the above-described semiconductor device, a protrusion may be arranged on the surface of the intermediate plate, adjacent to the semiconductor element, and the protrusion may extend along an end of the first through-hole.

The protrusion extending along the end of the first through-hole may be formed by bending a portion corresponding to the first through-hole at the time when the first through-hole is formed in the intermediate plate.

With the above configuration, it is possible to further effectively suppress shrinkage of the resin layer in the direction along the intermediate plate or the main plate.

In the above-described semiconductor device, a projected portion may be formed on the surface of the intermediate plate within a range in which the intermediate plate faces the semiconductor element.

With this configuration, it is possible to ensure the thickness of the brazing filler metal between the semiconductor element and the intermediate plate at a certain thickness or larger. Thermal stress concentrates at a portion at which the brazing filler metal is thin, and cracks are easy to develop; however, with the above configuration, it is possible to suppress concentration of thermal stress that occurs in the brazing filler metal.

In the above-described semiconductor device, a projected portion may be formed on the surface of the intermediate plate within a range in which the intermediate plate faces the main plate.

With this configuration, it is possible to ensure the thickness of the brazing filler metal between the main plate and the intermediate plate at a certain thickness or larger. Thermal stress concentrates at a portion at which the brazing filler metal is thin, and cracks are easy to develop; however, with the above configuration, it is possible to suppress concentration of thermal stress that occurs in the brazing filler metal.

In the above-described semiconductor device, a second through-hole may be formed in the intermediate plate at a position at which the second through-hole faces a corner of the semiconductor element, and the resin layer may also be arranged inside the second through-hole.

With this configuration, it is possible to further suppress thermal stress that occurs in the brazing filler metal.

In the above-described semiconductor device, the intermediate plate may include a first plate and a second plate. The second plate may be stacked on the first plate on a side adjacent to the main plate. The first through-hole may extend through the first plate and the second plate. A protrusion may be arranged on a surface of the first plate, the surface of the first plate adjacent to the semiconductor element. The protrusion arranged on the surface of the first plate may extend along an end of the first through-hole. A protrusion may be arranged on a surface of the second plate, the surface of the second plate adjacent to the semiconductor element. The protrusion arranged on the surface of the second plate may extend along an end of the first through-hole, pass through an inside of the first through-hole of the first plate and protrude from the surface of the first plate, the surface adjacent to the semiconductor element.

With this configuration, it is possible to further freely arrange the protrusion in the intermediate plate.

A second aspect of the invention provides a manufacturing method for a semiconductor device. In the semiconductor device, a first through-hole is formed in an external region, and a projected portion is formed on a surface of an intermediate plate within a range in which the intermediate plate faces a semiconductor element. The manufacturing method includes stacking the semiconductor element, the intermediate plate and a main plate; and, in a state where a load toward the main plate is applied to the semiconductor element, brazing the intermediate plate to the semiconductor element and the main plate.

When the first through-hole or the projected portion is formed in the intermediate plate, a warp may occur in the intermediate plate. With the above-described manufacturing method, the intermediate plate is brazed while applying a load to the intermediate plate via the semiconductor element, so it is possible to braze the intermediate plate in a state where the intermediate plate is in a flat state. Because the projected portion is formed in the intermediate plate, even when a load is applied to the semiconductor element, it is possible to ensure the thickness of the brazing filler metal between the semiconductor element and the intermediate plate at a certain thickness or larger.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
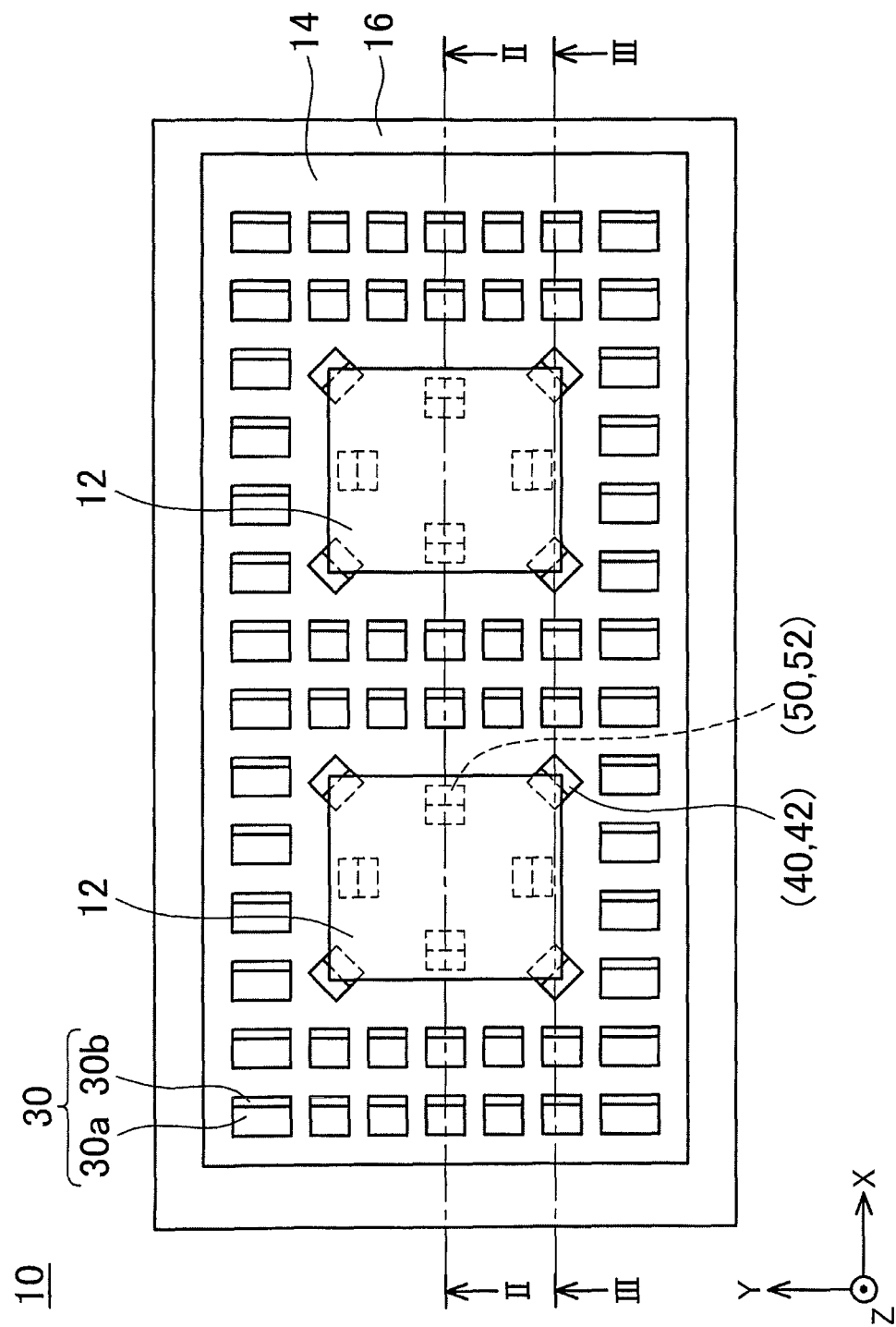
FIG. 1 is a plan view of a semiconductor device according to a first embodiment (a view in which a resin layer is not shown)
Figure 2:
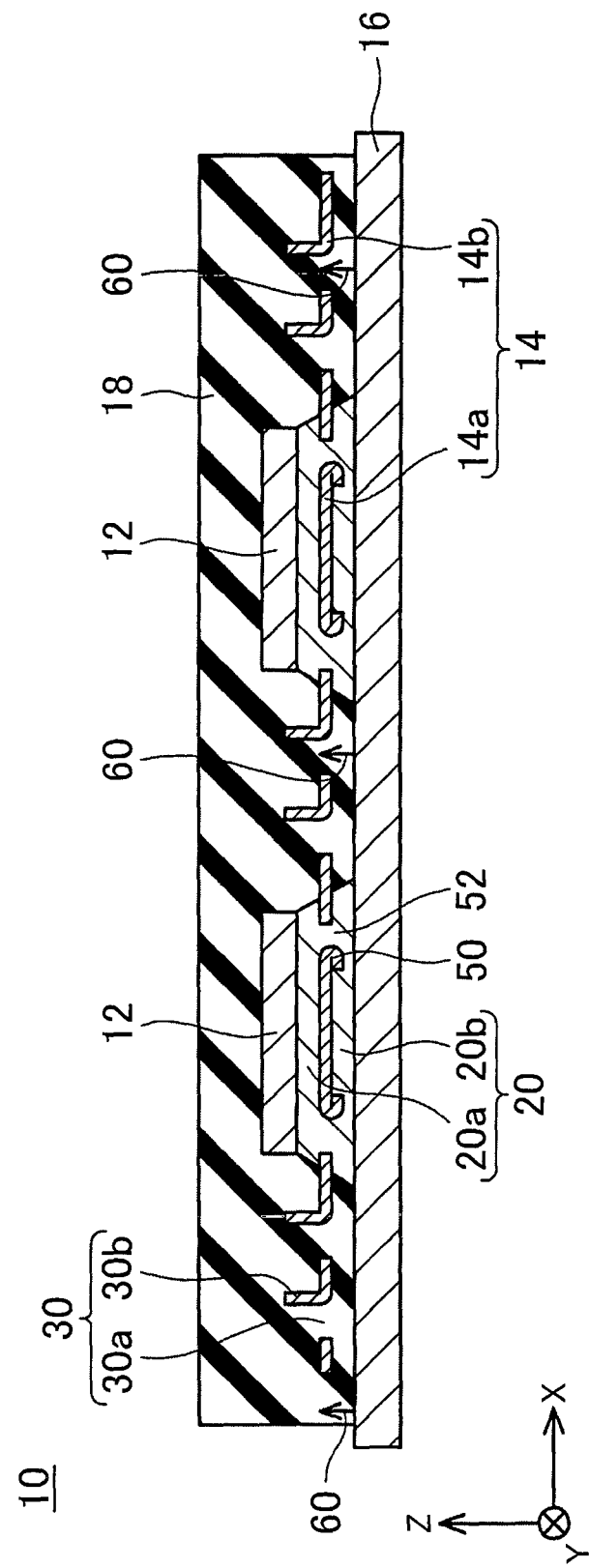
FIG. 2 is a longitudinal cross-sectional view taken along the line II-II in FIG. 1.
Figure 3:
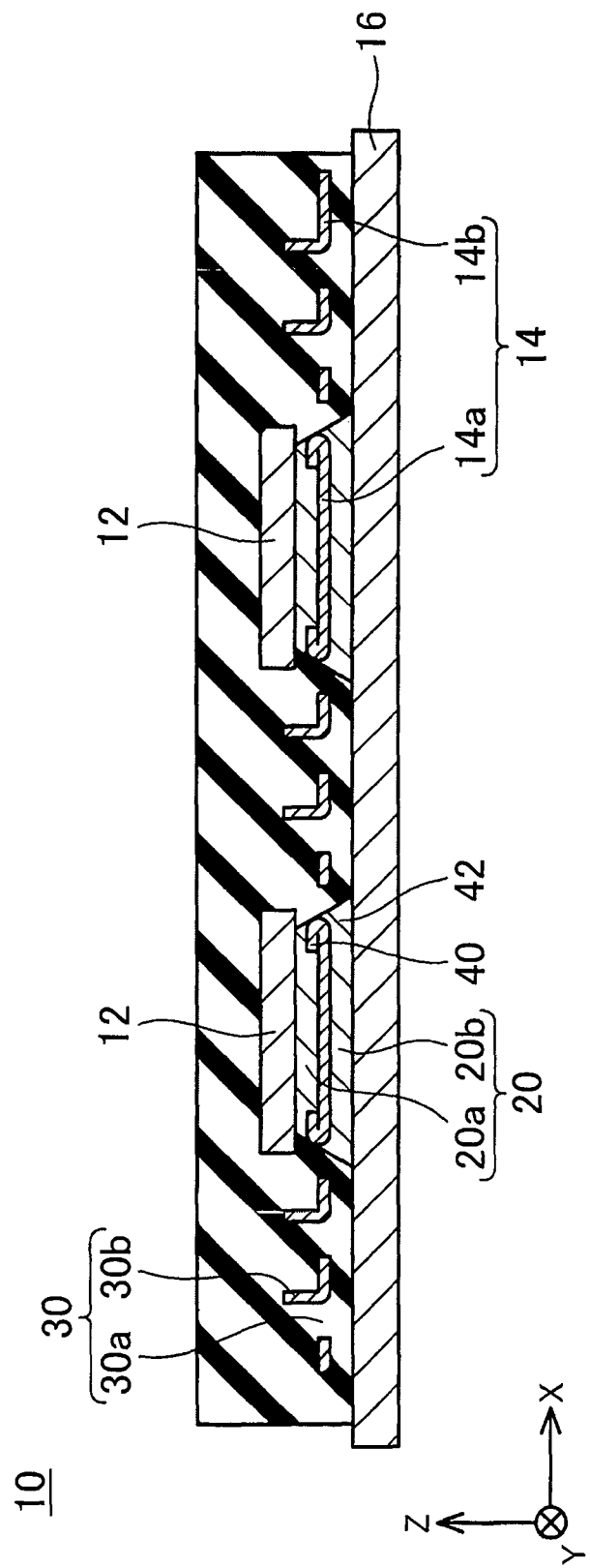
FIG. 3 is a longitudinal cross-sectional view taken along the line in FIG. 1.

A semiconductor device 10 according to a first embodiment shown in FIG. 1 to FIG. 3 includes two semiconductor elements 12, a stress relaxation plate 14, a heatsink 16 and a resin layer 18. In FIG. 1, for the sake of description, the resin layer 18 is not shown.

The heatsink 16 is a copper plate. The heatsink 16 also serves as an electrode of the semiconductor device 10. The coefficient of linear expansion of the heatsink 16 is about 17 ppm.

The stress relaxation plate 14 is arranged on the upper side of the heatsink 16. In FIG. 2, the stress relaxation plate 14 is not in contact with the heatsink 16; however, these may be in contact with each other. The stress relaxation plate 14 is a thin plate made of a Cu—Mo alloy. Ni plating is applied to the surface of the stress relaxation plate 14. The coefficient of linear expansion of the stress relaxation plate 14 is about 11 ppm.

The semiconductor elements 12 are arranged on the upper side of the stress relaxation plate 14. In FIG. 2, the semiconductor elements 12 are not in contact with the stress relaxation plate 14; however, these may be partially in contact with each other. Each of the semiconductor elements 12 includes a semiconductor substrate and electrodes formed on the upper and lower faces of the semiconductor substrate. In the drawings, the upper face electrode and lower face electrode of each semiconductor element 12 are not shown. The semiconductor substrate is made of SiC. The coefficient of linear expansion of each semiconductor element 12 is about 5 ppm.

The semiconductor elements 12, the stress relaxation plate 14 and the heatsink 16 are connected to one another by solder layers 20 (that is, brazing filler metal). More specifically, the lower face electrode of each semiconductor element 12 is connected to the stress relaxation plate 14 by the corresponding solder layer 20. The stress relaxation plate 14 is connected to the heatsink 16 by the solder layers 20. Hereinafter, each solder layer 20 between the stress relaxation plate 14 and the corresponding semiconductor element 12 is termed an upper solder layer 20a, and each solder layer 20 between the stress relaxation plate 14 and the heatsink 16 is termed a lower solder layer 20b. Although not shown in the drawing, the upper face electrode of each semiconductor element 12 is connected to a terminal (not shown) via a wire.

The resin layer 18 covers the entire semiconductor elements 12, the entire solder layers 20 and the entire stress relaxation plate 14 and the upper face of the heatsink 16.

Part of the stress relaxation plate 14 extends to the outer side of the solder layers 20. That is, the stress relaxation plate 14 has a region in which both the upper face and lower face of the stress relaxation plate 14 are not in contact with the solder layers 20. Hereinafter, within the stress relaxation plate 14, a region located within the solder layers 20 is termed an internal region 14a, and a region located outside the solder layers 20 is termed an external region 14b. The external region 14b is in contact with the resin layer 18.

A large number of anchor structures 30 are formed in the external region 14b. Each anchor structure 30 has a through-hole 30a and a protrusion 30b. Each through-hole 30a extends through the stress relaxation plate 14 from the upper face to the lower face. Each protrusion 30b is a portion that protrudes upward from the upper face of the stress relaxation plate 14. Each protrusion 30b extends along an end of the corresponding through-hole 30a. More specifically, each protrusion 30b extends along the end located at a side extending in an Y direction among ends located at four sides of the substantially rectangular through-hole 30a. Each protrusion 30b is formed by bending a portion corresponding to the corresponding through-hole 30a at substantially a right angle at the time when the corresponding through-hole 30a is formed in the stress relaxation plate 14.

A plurality of projected portions 40 are formed in the internal region 14a (see FIG. 3). Each projected portion 40 is a portion that projects upward from the upper face of the stress relaxation plate 14. Each projected portion 40 is formed at a position at which the projected portion 40 faces the corresponding semiconductor element 12 (that is, on the lower side of the corresponding semiconductor element 12). In FIG. 3, the projected portions 40 are not in contact with the corresponding semiconductor element 12; however, these may be in contact with each other. Within the stress relaxation plate 14, a through-hole 42 is formed at a position adjacent to each projected portion 40. Each through-hole 42 extends through the stress relaxation plate 14 from the upper face to the lower face. Each projected portion 40 is formed by bending a portion corresponding to the through-hole 42 by substantially 180 degrees at the time when the corresponding through-hole 42 is formed in the stress relaxation plate 14.

A plurality of projected portions 50 are formed in the internal region 14a (see FIG. 2). Each projected portion 50 is a portion that projects downward from the lower face of the stress relaxation plate 14. Each projected portion 50 is formed at a position at which the projected portion 50 faces the heatsink 16 (that is, on the upper side of the heatsink 16). In FIG. 2, the projected portions 50 are not in contact with the heatsink 16; however, these may be in contact with each other. Within the stress relaxation plate 14, a through-hole 52 is formed at a position adjacent to the corresponding projected portion 50. Each through-hole 52 extends through the stress relaxation plate 14 from the upper face to the lower face. Each projected portion 50 is formed by bending a portion corresponding to the through-hole 52 by substantially 180 degrees at the time when the corresponding through-hole 52 is formed in the stress relaxation plate 14.

Next, a manufacturing method for the semiconductor device 10 will be described. Initially, by pressing or bending the planar stress relaxation plate 14, the anchor structures 30, the projected portions 40 and the projected portions 50 are formed in the stress relaxation plate 14. Because the stress relaxation plate 14 is thin, a warp may occur in the stress relaxation plate 14 when the stress relaxation plate 14 is subjected to the above-described working. Subsequently, creamed solder is applied to each of the upper face of the heatsink 16 and the upper face of the stress relaxation plate 14. Creamed solder is applied to regions corresponding to the above-described upper solder layers 20a and lower solder layers 20b. Subsequently, the stress relaxation plate 14 is placed on the heatsink 16. After that, the semiconductor elements 12 are placed on the stress relaxation plate 14. In addition, weights are respectively placed on the semiconductor elements 12. A load toward the heatsink 16 acts on each of the semiconductor elements 12 by the corresponding weight. A warp may occur in the stress relaxation plate 14 as described above; however, the stress relaxation plate 14 is kept in substantially a flat shape by the load caused by the weights. Because the projected portions 40 are formed on the upper face of the stress relaxation plate 14, even when the load caused by the weights is applied, the spacing between the semiconductor elements 12 and the stress relaxation plate 14 (that is, the thickness of creamed solder present between the elements 12 and the stress relaxation plate 14) is ensured by at least the height of each projected portion 40. Because the projected portions 50 are formed on the lower face of the stress relaxation plate 14, even when the load caused by the weights is applied, the spacing between the stress relaxation plate 14 and the heatsink 16 (that is, the thickness of creamed solder present between the stress relaxation plate 14 and the heatsink 16) is ensured by at least the height of each projected portion 50.

When the members are set as described above, the set members are passed through a reflow furnace. At the passage of the reflow furnace, the creamed solder once melts, and, after that, solidifies. Thus, the solder layers 20 are formed. That is, the semiconductor elements 12, the stress relaxation plate 14 and the heatsink 16 are connected to one another by the solder layers 20. As described above, the stress relaxation plate 14 is held in substantially a flat shape by the load inside the reflow furnace, so the stress relaxation plate 14 is directly fixed in substantially the flat shape by the solidified solder layers 20. As described above, because the spacing between each semiconductor element 12 and the stress relaxation plate 14 is ensured by the projected portions 40, the thickness of each upper solder layer 20a is ensured. That is, because the projected portions 40 are formed, the minimum thickness of each upper solder layer 20a is guaranteed. As described above, because the spacing between the stress relaxation plate 14 and the heatsink 16 is ensured by the projected portions 50, the thickness of each lower solder layer 20b is ensured. That is, because the projected portions 50 are formed, the minimum thickness of each lower solder layer 20b is guaranteed.

Subsequently, the upper face electrode of each semiconductor element 12 is connected to a terminal (not shown) via wire bonding, or the like. After that, by applying resin molding to a semi-finished product, the resin layer 18 is formed. That is, the semi-finished product is set in a cavity, and molten resin is poured into the cavity. The protrusions 30b of the stress relaxation plate 14 are provided in an orientation in which the protrusions 30b do not interfere with flow of molten resin in a resin molding process. More specifically, the protrusions 30b are arranged in a direction in which resin flows in the resin molding process. Thus, it is possible to suitably carry out the resin molding process. When molten resin is filled in the cavity, the resin is cooled and solidified. Thus, the resin layer 18 is formed, and the semiconductor device 10 is completed.

When the resin layer 18 solidifies, the resin layer 18 shrinks. Therefore, stress resulting from shrinkage occurs in the resin layer 18. Stress also acts at a contact face between the resin layer 18 and the heatsink 16 in a direction indicated by the arrows 60 in FIG. 2. When the resin layer 18 deforms because of the stress, the resin layer 18 peels off from the heatsink 16, so it is inconvenient. However, in the semiconductor device 10, deformation of the resin layer 18 is suppressed by the stress relaxation plate 14 that extends inside the resin layer 18. Particularly, near each through-hole 30a, the upper face and lower face of the stress relaxation plate 14 and the inner face of the through-hole 30a of the stress relaxation plate 14 are covered with the resin layer 18. Therefore, the stress relaxation plate 14 and the resin layer 18 are difficult to relatively move. More specifically, relative movement of the resin layer 18 with respect to the stress relaxation plate 14 in the X direction, the Y direction or the Z direction is suppressed. Thus, deformation of the resin layer 18 and deformation of the stress relaxation plate 14 are suppressed. Because of the anchor effect of each through-hole 30a, peeling of the resin layer 18 from the heatsink 16 is suppressed in the semiconductor device 10. In addition, the stress relaxation plate 14 has the protrusions 30b. In the first embodiment, because the protrusions 30b extend in the Y direction, the protrusions 30b suppress relative movement of the resin layer 18 with respect to the stress relaxation plate 14 in the X direction. With the anchor effect of the protrusions 30b as well, peeling of the resin layer 18 from the heatsink 16 is suppressed. Thus, in the semiconductor device 10, the resin layer 18 is extremely less likely to peel off from the heatsink 16, so it is possible to efficiently manufacture the semiconductor device 10.

Figure 4:
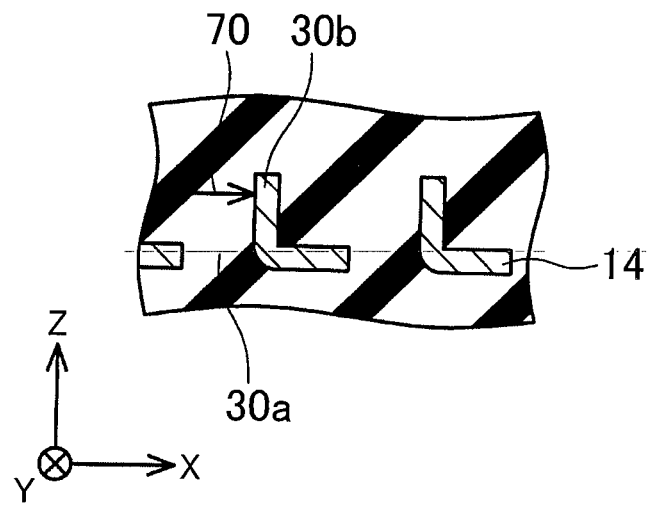
FIG. 4 is an enlarged cross-sectional view of an anchor structure.
Figure 5:
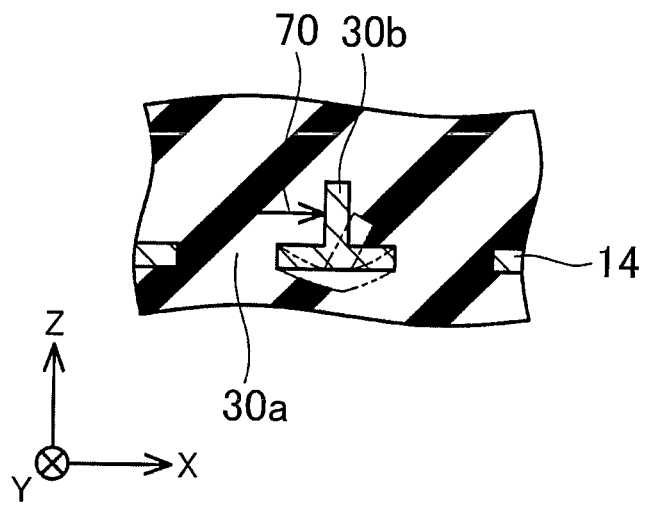
FIG. 5 is an enlarged cross-sectional view of anchor structures according to a comparative embodiment.

Each protrusion 30b is formed along the end of the corresponding through-hole 30a, so the anchor effect of each protrusion 30b is further increased. That is, as indicated by the arrow 70 in FIG. 4, when stress in the X direction acts on the protrusion 30b, force also acts on the stress relaxation plate 14 at the proximal portion of the protrusion 30b. Near each through-hole 30a, the stress relaxation plate 14 contacts the resin layer 18 at the upper face and lower, face of the stress relaxation plate 14 and the inner face of the through-hole 30a of the stress relaxation plate 14. In other words, the resin layer 18 on the upper face of the stress relaxation plate 14 and the resin layer 18 on the lower face of the stress relaxation plate 14 are connected by the resin layer 18 in the through-holes 30a. Therefore, near each through-hole 30a, the stress relaxation plate 14 itself is firmly fixed to the resin layer 18. On the other hand, at positions remote from the through-holes 30a, the stress relaxation plate 14 is just in contact with the resin layer 18 at the upper face and lower face of the stress relaxation plate 14. Therefore, at positions remote from the through-holes 30a, the stress relaxation plate 14 is easy to deflect as compared to positions near the through-holes 30a. As shown in FIG. 5 as a comparative embodiment, when each protrusion 30b is formed at a position remote from the corresponding through-hole 30a, the stress relaxation plate 14 may deflect under stress indicated by the arrow 70 and acting on the protrusion 30b, as indicated by the long and two-short dashed line in FIG. 5. In contrast, in the semiconductor device 10 according to the first embodiment, each protrusion 30b is formed along the end of the corresponding through-hole 30a as shown in FIG. 4, the stress relaxation plate 14 is difficult to deform, so it is possible to further effectively suppress peeling of the resin layer 18. With the configuration shown in FIG. 4, each protrusion 30b is allowed to be formed by bending, so it is possible to easily form each protrusion 30b.

Stress that occurs in the resin layer 18 tends to increase particularly in a region between the two semiconductor elements 12. Thus, peeling of the resin layer 18 from the heatsink 16 is easy to occur in the region between the two semiconductor elements 12. The stress increases as the spacing between the two semiconductor elements 12 narrows. With the configuration according to the first embodiment, the anchor structures 30 are also formed in the region between the two semiconductor elements 12, so it is possible to suppress peeling of the resin layer 18 in this region. Therefore, it is possible to narrow the spacing between the two semiconductor elements 12 as compared to the existing technique. Thus, it is possible to achieve a reduction in the size of the semiconductor device 10.

When the semiconductor device 10 is used, the semiconductor elements 12 generate heat. Because there is a large difference in the coefficient of linear expansion between each semiconductor element 12 and the heatsink 16, when the semiconductor elements 12 and the heatsink 16 thermally expand as a result of generation of heat, thermal stress is applied to the solder layers 20. When thermal stress is repeatedly applied to the solder layers 20, cracks develop in the solder layers 20, with the result that thermal resistance increases between each semiconductor element 12 and the heatsink 16. There also arises an inconvenience in electrical and mechanical reliability of the solder layers 20. However, in the semiconductor device 10, the stress relaxation plate 14 is arranged between each semiconductor element 12 and the heatsink 16, and the stress relaxation plate 14 has a larger coefficient of linear expansion than each semiconductor element 12 and a smaller coefficient of linear expansion than the heatsink 16. In this way, the stress relaxation plate 14 has a coefficient of linear expansion between the coefficient of linear expansion of each semiconductor element 12 and the coefficient of linear expansion of the heatsink 16. Therefore, it is possible to suppress thermal stress that acts on the solder layers 20 (that is, the upper solder layers 20a and the lower solder layers 20b). In addition, in the semiconductor device 10, as described above, the minimum thickness of each of the upper solder layers 20a and the lower solder layers 20b is guaranteed by the projected portions 40, 50. In this way, by ensuring the thickness of each solder layer 20, concentration of thermal stress at a thin portion of each solder layer 20 is suppressed. Thus, in the semiconductor device 10, cracks are difficult to develop in the solder layers 20, so the reliability of the solder layers 20 is high.

A semiconductor device 100 according to a second embodiment will be described with reference to FIG. 6 to FIG. 8. In the following description, like reference numerals to those of the first embodiment denote component elements of the semiconductor device 100, corresponding to those of the semiconductor device 10 according to the first embodiment. The description of the configuration common to that of the first embodiment is omitted.

In the semiconductor device 100 according to the second embodiment, the projected portions 40, 50 according to the first embodiment are not formed in the stress relaxation plate 14. Instead, in the semiconductor device 100 according to the second embodiment, through-holes 110, projected portions 140 and projected portions 150 are formed in the stress relaxation plate 14. The other configuration of the semiconductor device 100 is substantially equal to that of the semiconductor device 10 according to the first embodiment.

Figure 6:
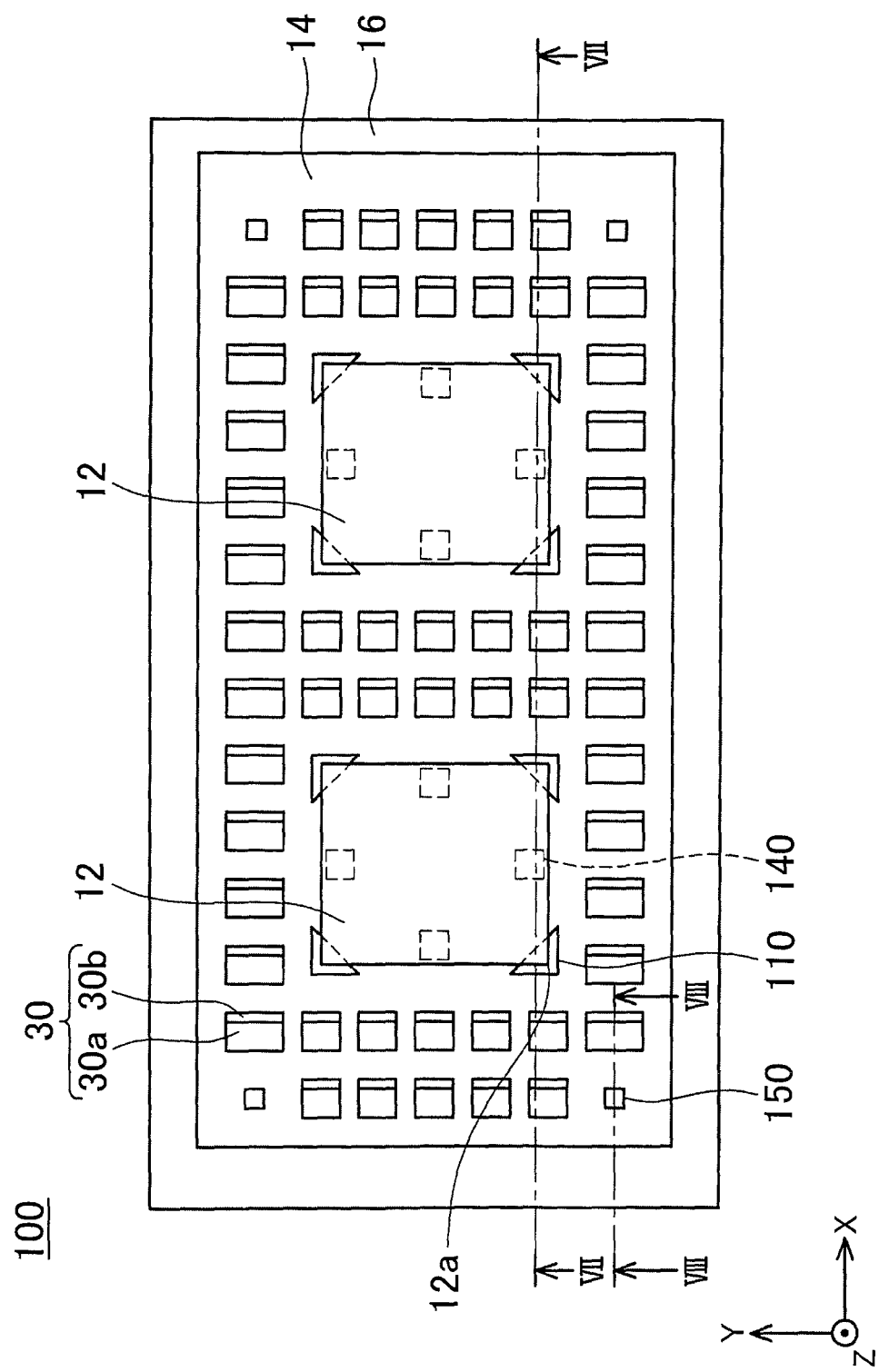
FIG. 6 is a plan view of a semiconductor device according to a second embodiment (a view in which a resin layer is not shown)

As shown in FIG. 6, each through-hole 110 is formed just under each corner 12a of each semiconductor element 12. As shown in FIG. 7, the resin layer 18 is filled inside the through-holes 110. The solder layers 20 are not connected to the corners 12a of the semiconductor elements 12. That is, the lower face of each corner 12a of each semiconductor element 12 is covered with the resin layer 18. As described above, when the semiconductor device 100 is used, thermal stress occurs in the solder layers 20. The thermal stress tends to increase near each corner 12a of each semiconductor element 12. In the semiconductor device 100 according to the second embodiment, by providing the through-holes 110 in the stress relaxation plate 14 at positions on the lower sides of the corners 12a of the semiconductor elements 12, each corner 12a is not bonded to the corresponding solder layer 20. Thus, generation of high stress in each solder layer 20 is suppressed.

Figure 7:
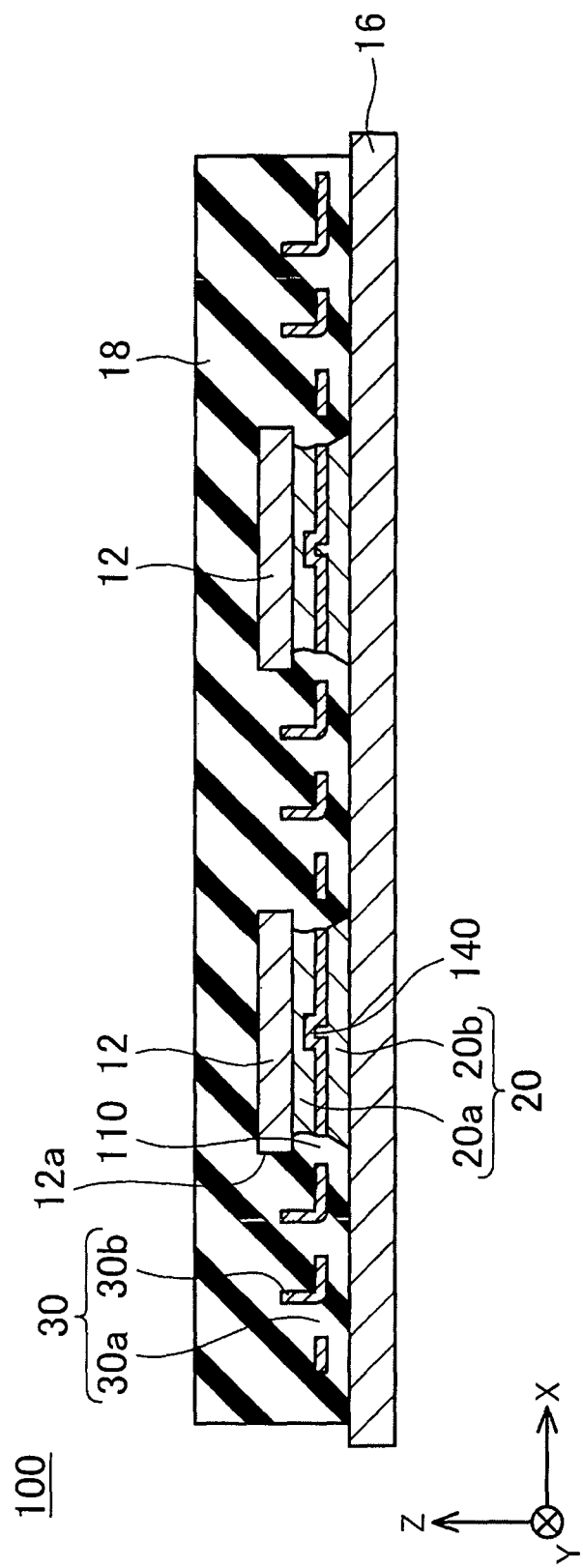
FIG. 7 is a longitudinal cross-sectional view taken along the line VII-VII in FIG. 6.

As shown in FIG. 7, in the semiconductor device 100, the projected portions 140 formed to project upward are formed in the stress relaxation plate 14 at positions below the corresponding semiconductor elements 12. The projected portions 140 have a projected shape, and are formed by pressing the stress relaxation plate 14. With the projected portions 140, as well as the projected portions 40 according to the first embodiment, it is possible to ensure the spacing between each semiconductor element 12 and the stress relaxation plate 14. Thus, the thickness of each upper solder layer 20a is ensured, so it is possible to suppress thermal stress that occurs in each upper solder layer 20a.

Figure 8:
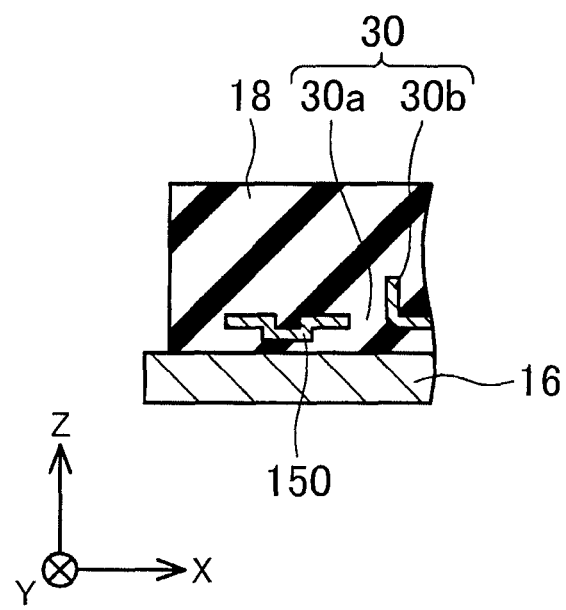
FIG. 8 is a longitudinal cross-sectional view taken along the line VIII-VIII in FIG. 6.

As shown in FIG. 8, in the semiconductor device 100, each projected portion 150 projected downward is formed in the external region 14b of the stress relaxation plate 14. Each projected portion 150 has a projected shape, and is formed by pressing the stress relaxation plate 14. With the projected portions 150, as well as the projected portions 50 according to the first embodiment, it is possible to ensure the spacing between the stress relaxation plate 14 and the heatsink 16. Thus, the thickness of each lower solder layer 20b is ensured, so it is possible to suppress thermal stress that occurs in each lower solder layer 20b. In this way, the projected portions for ensuring the thickness of each lower solder layer 20b may be formed in the external region 14b (that is, the outer side of the solder layers 20).

Figure 9:
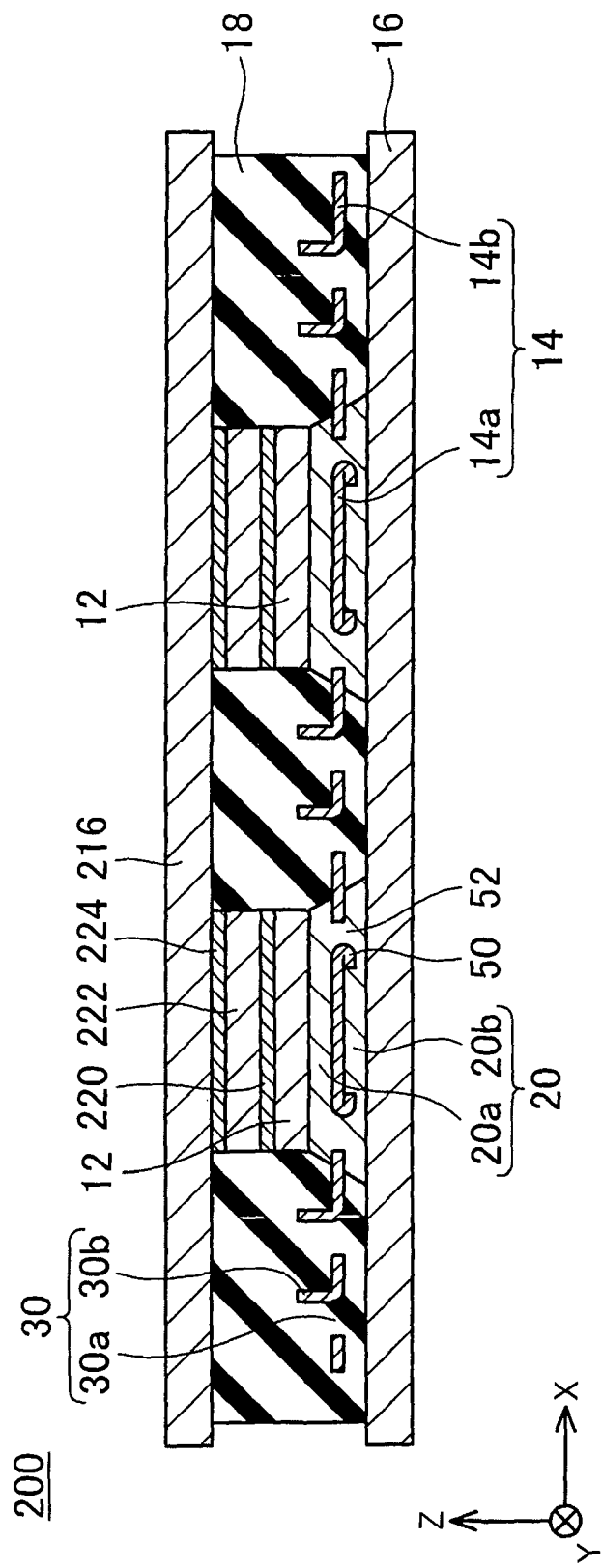
FIG. 9 is a longitudinal cross-sectional view of a semiconductor device according to a third embodiment (a view in which a resin layer is not shown)

A semiconductor device 200 according to a third embodiment will be described with reference to FIG. 9. In the following description, like reference numerals to those of the first embodiment denote component elements of the semiconductor device 200, corresponding to those of the semiconductor device 10 according to the first embodiment. The description of the configuration common to that of the first embodiment is omitted.

In the semiconductor device 200 according to the third embodiment, the upper face electrode of each semiconductor element 12 is connected to a heatsink 216 via a corresponding solder layer 220, a corresponding copper block 222 and a corresponding solder layer 224. The heatsink 216 also serves as an electrode of the semiconductor device 200. In this way, the upper face electrode of each semiconductor element 12 is also connected to the heatsink 216. Thus, it is possible to further effectively suppress an increase in the temperature of each semiconductor element 12. In soldering process of the semiconductor device 200, initially, the members from the heatsink 16 to the copper blocks 222 are soldered while applying a load, and subsequently the heatsink 216 is soldered while applying a load. The semiconductor device 200 is implemented by soldering in two steps. Thus, it is possible to suppress a warp of the stress relaxation plate 14. In soldering process of the semiconductor device 200 according to the third embodiment, in addition to the heatsink 216 and the copper blocks 222, another component that applies a load toward the heatsink 16 to the semiconductor elements 12 may be added.

In any one of the above described embodiments, when the resin layer 18 contains a filler, the size of each of the through-holes 30a provided in the stress relaxation plate 14 is desirably larger than the size of the filler.

In any one of the above-described embodiments, all the protrusions 30b are formed in the same direction. However, the protrusion 30b extending in different directions may be formed in the single stress relaxation plate 14. For example, the protrusions 30b extending in the X direction and the protrusions 30b extending in the Y direction may be mixedly included.

Figure 10:
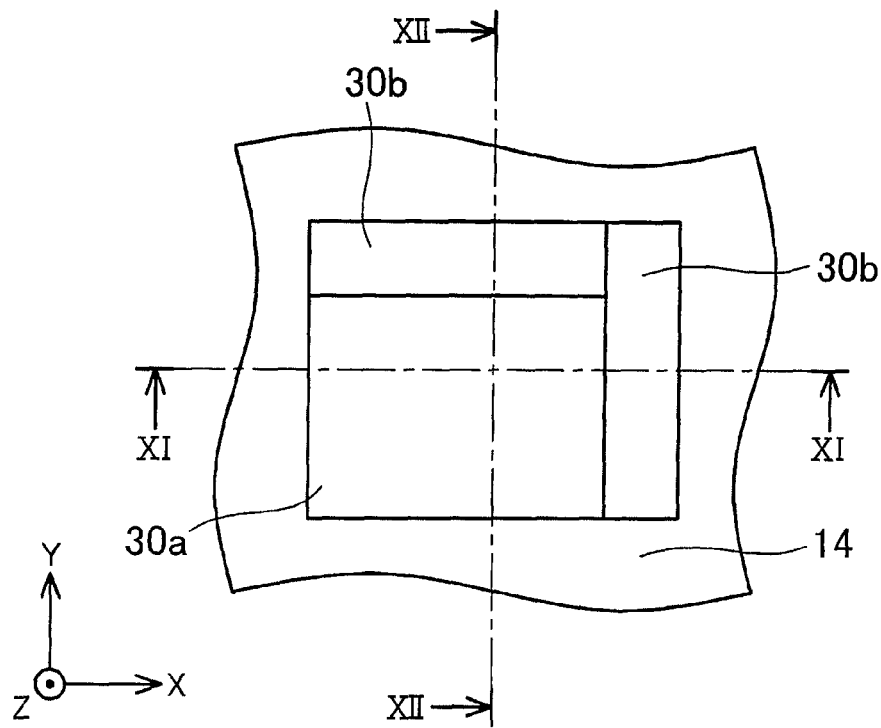
FIG. 10 is a plan view of an anchor structure according to an alternative embodiment (a view in which a resin layer is not shown)
Figure 11:
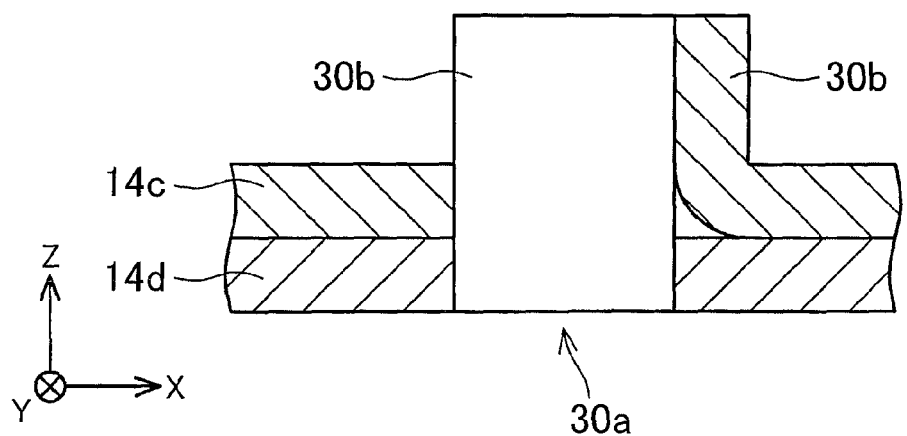
FIG. 11 is a longitudinal cross-sectional view taken along the line XI-XI in FIG. 10 (a view in which a resin layer 18 is not shown)
Figure 12:
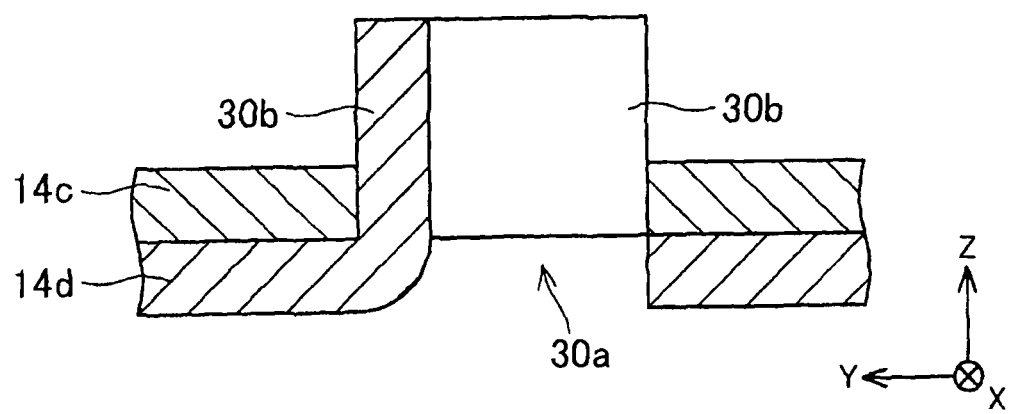
FIG. 12 is a longitudinal cross-sectional view taken along the line XII-XII in FIG. 10 (a view in which a resin layer is not shown).

In any one of the above-described embodiments, as shown in FIG. 10 to FIG. 12, two protrusions 30b may be formed in correspondence with each single through-hole 30a. In FIG. 10 to FIG. 12, for the sake of description, the resin layer 18 is not shown. In FIG. 10 to FIG. 12, the stress relaxation plate 14 is formed of an upper plate 14c and a lower plate 14d. Each through-hole of the upper plate 14c and a corresponding one of through-holes of the lower plate 14d are continuous with each other to form the single through-hole 30a. The upper plate 14c has the protrusions 30b each extending along an end of the corresponding through-hole 30a in the Y direction. The lower plate 14d has the protrusions 30b each extending along an end of the corresponding through-hole 30a in the X direction. Each protrusion 30b of the lower plate 14d passes through the inside of the corresponding through-hole of the upper plate 14c and protrudes to the upper side of the upper plate 14c. With this configuration, it is possible to exercise high anchor effect in both directions, that is, the X direction and the Y direction, with each single anchor structure 30.

In the manufacturing process according to any one of the above-described embodiments, the surface of the stress relaxation plate 14 may be subjected to surface roughening. With this configuration, it is possible to further increase the anchor effect between the stress relaxation plate 14 and the resin layer 18 by the roughened surface. Roughened nickel plating (thickness of about 10 μm) may be used as the surface roughening. On the surface-roughened surface, wettability of solder may deteriorate. Thus, surface roughening may be subjected to only a region outside the soldered region. Alternatively, wettability of solder may be improved by applying Pd/Au plating to the surface-roughened surface.

What is claimed is:

1. A semiconductor device comprising:
   an intermediate plate;
   two semiconductor elements connected to one of surfaces of the intermediate plate by a brazing filler metal adjacent to the two semiconductor elements;
   a main plate connected to the other one of the surfaces of the intermediate plate by a brazing filler metal adjacent to the main plate; and
   a resin layer,
   the intermediate plate having an external region extending to an outer side with respect to both a region in which the intermediate plate is connected to the brazing filler metal adjacent to the two semiconductor elements and a region in which the intermediate plate is connected to the brazing filler metal adjacent to the main plate,
   a first through-hole extending through the intermediate plate in the external region, and a third through-hole extending through the intermediate plate and in an area between the two semiconductor elements, the resin layer covering at least the brazing filler metal adjacent to the two semiconductor elements, the intermediate plate, the brazing filler metal adjacent to the main plate and a surface of the main plate in which the main plate faces the intermediate plate,
   the resin layer being also arranged inside the first through-hole.

2. The semiconductor device according to claim 1, wherein a protrusion is arranged on the surface of the intermediate plate, adjacent to the two semiconductor elements, and the protrusion extends along an end of the first through-hole.

3. The semiconductor device according to claim 2, wherein the protrusion extending along the end of the first through-hole is formed by bending a portion corresponding to the first through-hole at the time when the first through-hole is formed in the intermediate plate.

4. The semiconductor device according to claim 1, wherein a projected portion is formed on the surface of the intermediate plate within a range in which the intermediate plate faces the two semiconductor elements.

5. The semiconductor device according to claim 1, wherein a projected portion is formed on the surface of the intermediate plate within a range in which the intermediate plate faces the main plate.

6. The semiconductor device according to claim 1, wherein a second through-hole is formed in the intermediate plate at a position at which the second through-hole faces a corner of the two semiconductor elements, and the resin layer is also arranged inside the second through-hole.

7. The semiconductor device according to claim 1, wherein
   the intermediate plate includes a first plate and a second plate,
   the second plate is stacked on the first plate on a side adjacent to the main plate,
   the first through-hole extends through the first plate and the second plate, a protrusion is arranged on a surface of the first plate, the surface of the first plate adjacent to the two semiconductor elements, the protrusion arranged on the surface of the first plate extends along an end of the first through-hole, a protrusion is arranged on a surface of the second plate, the surface of the second plate adjacent to the two semiconductor elements, and the protrusion arranged on the surface of the second plate extends along an end of the first through-hole, passes through an inside of the first through-hole of the first plate and protrudes from the surface of the first plate, the surface adjacent to the two semiconductor elements.

8. A manufacturing method for the semiconductor device according to claim 4, comprising:

stacking the two semiconductor elements, an intermediate plate and a main plate; and in a state where a load toward the main plate is applied to the two semiconductor elements, brazing the intermediate plate to the two semiconductor elements and the main plate.

* * * * *